United States Patent
Schmidt

(10) Patent No.: US 9,653,451 B2
(45) Date of Patent: May 16, 2017

(54) SEMICONDUCTOR ARRANGEMENT WITH PROTECTION CIRCUIT

(71) Applicant: Micronas GmbH, Freiburg (DE)

(72) Inventor: Lothar Schmidt, Erbach (DE)

(73) Assignee: TDK-MICRONAS GMBH, Freiburg (DE)

( * ) Notice: Subject to any disclaimer, the term of this patent is extended or adjusted under 35 U.S.C. 154(b) by 0 days.

(21) Appl. No.: 15/078,303

(22) Filed: Mar. 23, 2016

(65) Prior Publication Data

US 2016/0284686 A1   Sep. 29, 2016

(30) Foreign Application Priority Data

Mar. 24, 2015 (DE) .......................... 10 2015 104 409

(51) Int. Cl.
  *H01L 27/02* (2006.01)
  *H01L 25/065* (2006.01)
(52) U.S. Cl.
  CPC ...... *H01L 27/0255* (2013.01); *H01L 25/0655* (2013.01); *H01L 25/0657* (2013.01); *H01L 2225/06506* (2013.01); *H01L 2225/06527* (2013.01); *H01L 2225/06555* (2013.01)
(58) Field of Classification Search
  CPC ............. H01L 27/0255; H01L 25/0655; H01L 25/0657; H01L 2225/06506; H01L 2225/06555; H01L 2225/06527
  USPC ......................................................... 257/603
  See application file for complete search history.

(56) References Cited

U.S. PATENT DOCUMENTS

| 2006/0103421 | A1* | 5/2006 | Hirata ..................... H01L 23/50 326/62 |
| 2010/0006943 | A1 | 1/2010 | Chen |
| 2010/0127359 | A1 | 5/2010 | Bazarjani et al. |
| 2013/0063843 | A1* | 3/2013 | Chen ..................... H01L 23/552 361/56 |
| 2013/0070376 | A1 | 3/2013 | Zhu et al. |

FOREIGN PATENT DOCUMENTS

EP    1363329 A2    11/2003

* cited by examiner

*Primary Examiner* — Fernando L Toledo
*Assistant Examiner* — Adam S Bowen
(74) *Attorney, Agent, or Firm* — 24IP Law Group; Timothy R DeWitt

(57) ABSTRACT

A semiconductor arrangement (10) with an electrostatic discharge (ESD) protection circuit is disclosed. The semiconductor arrangement (10) comprises a first semiconductor chip (20a) with a first integrated circuit (25a) and a second semiconductor chip (20b) with a second integrated circuit (25b). The semiconductor arrangement has an ESD protection circuit (30). The first semiconductor chip (20a) is isolated otherwise form the second semiconductor chip (20b) and the first integrated circuit (25a) is connected to the second integrated circuit (25b) exclusively via the ESD protection circuit (30).

13 Claims, 8 Drawing Sheets

SEMICONDUCTOR ARRANGEMENT WITH PROTECTION CIRCUIT

CROSS-REFERENCE TO RELATED APPLICATIONS

This application claims priority to and benefit of German Patent Application No. 10 2015 104 409.9 "Halbleiter-Anordnung mit ESD-Schutzschaltung (Semiconductor arrangement with ESD Protection Circuit), filed on 24 Mar. 2015, which is incorporated by reference herein in its entirety.

BACKGROUND OF THE INVENTION

Field of the Invention

The invention relates to a stacked semiconductor arrangement with an ESD protection circuit (ESD=electrostatic discharge).

Brief Description of the Related Art

Electrostatic discharge is a spark or a flashover occurring, for example, in an electronic circuit due to a large potential difference between two electronic components of the electronic circuit. The electrostatic discharge causes a very fast, very high electric voltage peak on an electronic component. This voltage peak can damage the electronic component. In particular in microelectronic circuits, the damage to the electronic components can be very large and lead to the functional failure of the microelectronic components. Particularly in semiconductor integrated circuits, the electrostatic discharge is one of the most frequent reasons for a malfunction of the semiconductor electronic circuit, and therefore numerous attempts have been made to counteract this problem.

For example, the European patent application no. EP 1 363 329 A2 (Micronas GmbH) teaches a protection structure against an electrostatic discharge using an MOS transistor.

A different solution for an ESD protection circuit is known, for example, from the US patent application no. US 2013/0070376 A1 (Semiconductor Manufacturing International (Beijing) Corporation). This ESD protection circuit of this patent application comprises a discharge path on the semiconductor chip. The discharge path comprises a plurality of MOS transistors connected in series between the ground line and the supply line. An ESD detection unit is connected to the gate of the MOS transistors and switches on the MOS transistors upon detecting an electrostatic discharge.

The U.S. Patent Application Publication No. 2010/0006943 discloses also an ESD protection circuit with a MOS transistor that is switched on upon occurrence of an electrostatic discharge.

From the U.S. Patent Application Publication No. 2010/0127359 A1, an ESD protection circuit is known, which can be removed after completion of the semiconductor chip. This ESD protection circuit comprises two diodes connected to ground.

The use of an ESD protection circuit in so-called dual-dies (two semiconductor chips) can provide a separate ESD protection circuit for each one of the semiconductor chips. In some cases, however, the two semiconductor chips need to be mutually isolated from one another, and in this case, upon an electrostatic discharge, there is no predefined current path between the connector on a first semiconductor chip and a further connector on the second semiconductor chip. A very large voltage can be caused thereby in the semiconductor arrangement with the two semiconductor chips. Thus, in such a case, a breakdown of the dielectric and damage of one or more of the electronic components in an integrated circuit on the semiconductor chip must be expected. The level at which the voltage breaks down is not predefined, and, as a result, the breakdown voltage is not predictable. Consequently, an ESD circuit is required for the protection of a semiconductor arrangement with several semiconductor chips to prevent the occurrence of an electrostatic discharge.

SUMMARY OF THE INVENTION

A semiconductor arrangement is described in this document. This semiconductor arrangement comprises a first semiconductor chip with a first integrated circuit and a second semiconductor chip with a second integrated circuit. The first semiconductor chip is stacked, for example, on the second semiconductor chip. The first semiconductor chip and the second semiconductor chip can also be arranged adjacent to each other, e.g. in a lead frame. An ESD protection circuit is connected between the second integrated circuit and the first integrated circuit and, upon occurrence of an electrostatic discharge, the ESD protection circuit turns itself on. The first semiconductor chip is thus substantially isolated from the second semiconductor chip. By connecting the ESD protection circuit between the first integrated circuit and the second integrated circuit, upon the electrostatic discharge, a current path is created which can prevent damage to the electronic components in either or both of the first semiconductor chip or the second semiconductor chip.

The ESD protection circuit can be connected either between the first ground line on the first semiconductor chip and the second ground line on the second semiconductor chip or between the first supply line on the first semiconductor chip and the second supply line on the second semiconductor chip. This enables a very flexible arrangement of the ESD protection circuit, since those connectors on the semiconductor chip can be used which are present in the closest proximity of the ESD protection circuit.

The ESD protection circuit can, for example, be formed of two partial circuits. One of the two partial circuits is integrated in the first semiconductor chip and the second of the two partial circuits is integrated in the second semiconductor chip. The ESD protection circuit is constructed of two branches, for example, with one diode and one Zener diode in each of the two branches. However, the use of a diode and a Zener diode in one branch is only an example. The protection circuit must become conductive in one direction of polarity on reaching a threshold voltage (in the taught example 40V), whereas the protection circuit is always non-conductive in the other direction of polarity.

During normal operation, the ESD protection circuit does not carry current. Upon the occurrence of a very high voltage, e.g. 40V, the voltage exceeds the breakdown voltage of the Zener diode and the current is conducted via a branch of the ESD protection circuit, as the Zener diode starts conducting.

In a further aspect, a further connector can be connected between two ESD protection circuits. This further connector can, for example, be connected to ground, thus providing a further current path upon the occurrence of the electrostatic discharge.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

The invention will hereinafter be explained more closely with reference to the figures of the drawings.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be also understood, that features of one aspect can be combined with features of a different aspect.

Figure 1A:
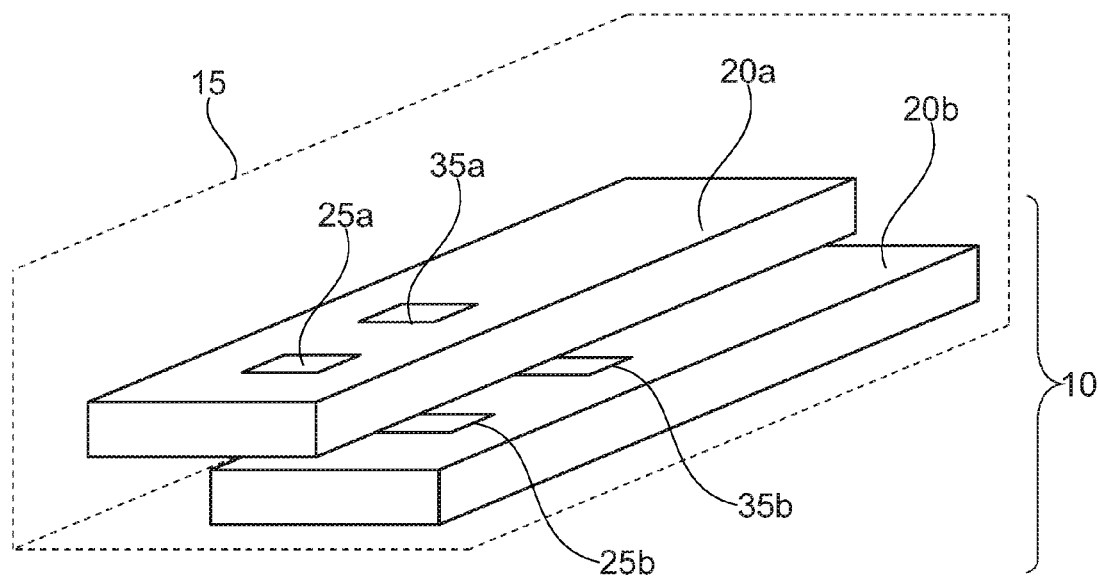
FIG. 1A shows the structure of a stacked semiconductor arrangement

FIG. 1A shows the structure of a stacked semiconductor arrangement 10. The semiconductor arrangement 10 has a first semiconductor chip 20a with a first integrated circuit 25a and a second semiconductor chip 20b with a second integrated circuit 25b. The first semiconductor chip 20a is stacked on top of the second semiconductor chip 20b. The first integrated circuit 25a and the second integrated circuit 25b are only shown in outline here. In practice, the first integrated circuit 25a and the second integrated circuit 25b will take up substantially more space on the semiconductor chip 20a, 20b.

An electrostatic discharge (ESD) protection circuit 30 in this aspect comprises a first partial circuit 35a integrated in the first semiconductor chip 20a, and a second partial circuit 35b integrated in the second semiconductor chip 20b. The first partial circuit 35a and the second partial circuit 35b are interconnected, as will be explained later, and thus jointly form the ESD protection circuit 30.

Figure 1B:
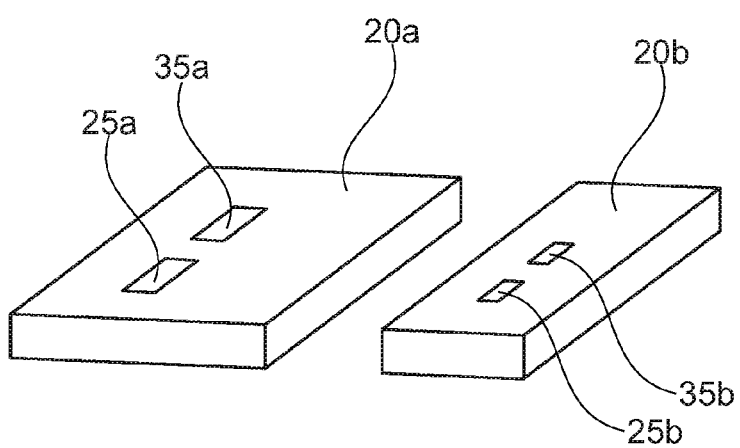
FIG. 1B shows the structure of a semiconductor arrangement in a lead frame.

In a further embodiment of the invention (FIG. 1B), the first semiconductor chip 20a is arranged next to the second semiconductor chip 20b, e.g. in a lead frame or on a chip carrier.

The first semiconductor chip 20a, the second semiconductor chip 20b and the protection circuit are accommodated in a common housing 15.

Figure 2A:
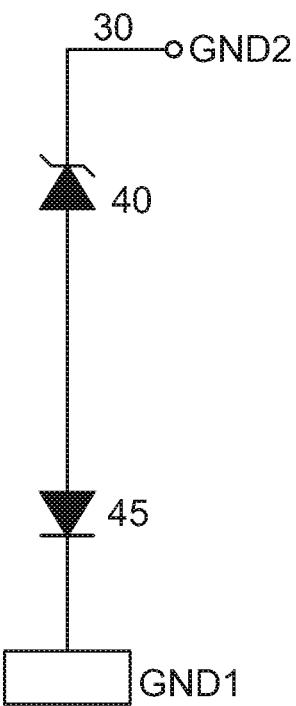
FIGS. 2A-2B show the equivalent circuit of the ESD protection circuit.
Figure 2B:
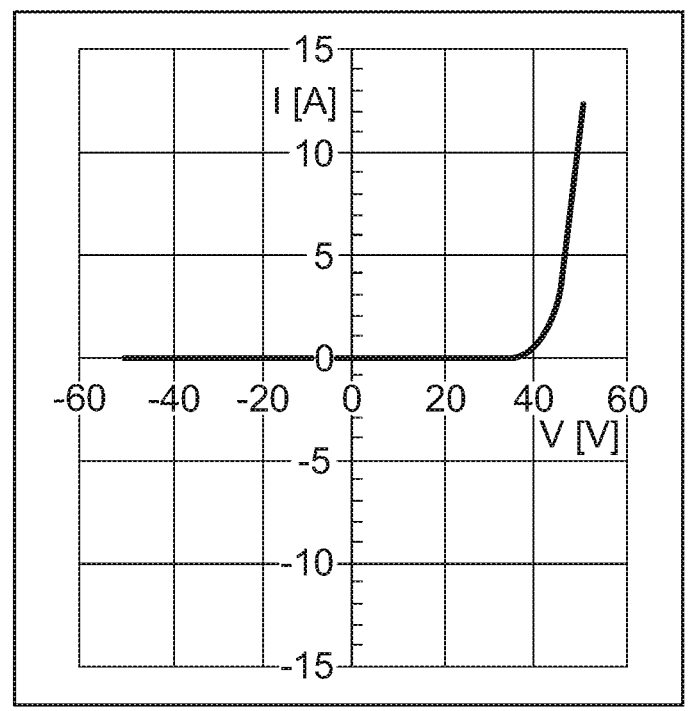

FIGS. 2A-2B show the equivalent circuit of the ESD protection circuit 30. The ESD protection circuit 30 in this aspect has a Zener diode 40 and a (normal) diode 45 connected in series between the ground line GND1 of the first semiconductor chip 20a and the second ground line GND2 of the second semiconductor chip 20b. The Zener diode 40 and the diode 45 are connected back to back, and thus normally no current flows between the first ground line GND1 and the second ground line GND2. Only upon reaching the breakdown voltage does the Zener diode become conductive and current flows between the second ground line GND1 and the second ground line GND2. It can be seen from the current-voltage characteristic of FIGS. 2A-2B that the breakdown voltage lies at around 40V in this exemplary aspect of the invention. The breakdown voltage can be adjusted by using different Zener diodes.

Figure 3A:
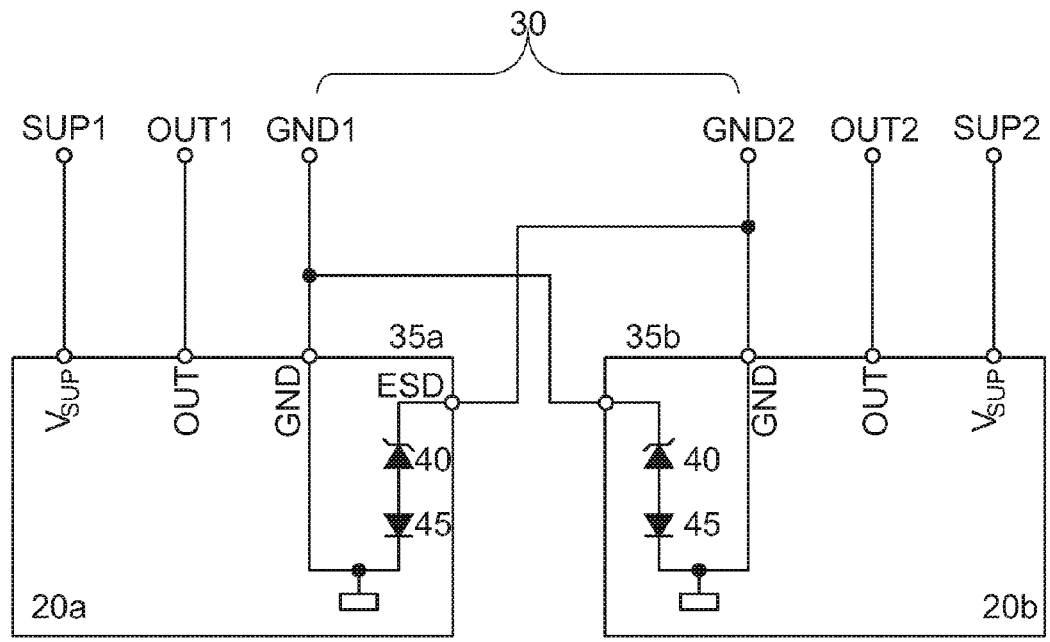
FIGS. 3A-3B show a first embodiment of the ESD protection circuit.
Figure 3B:
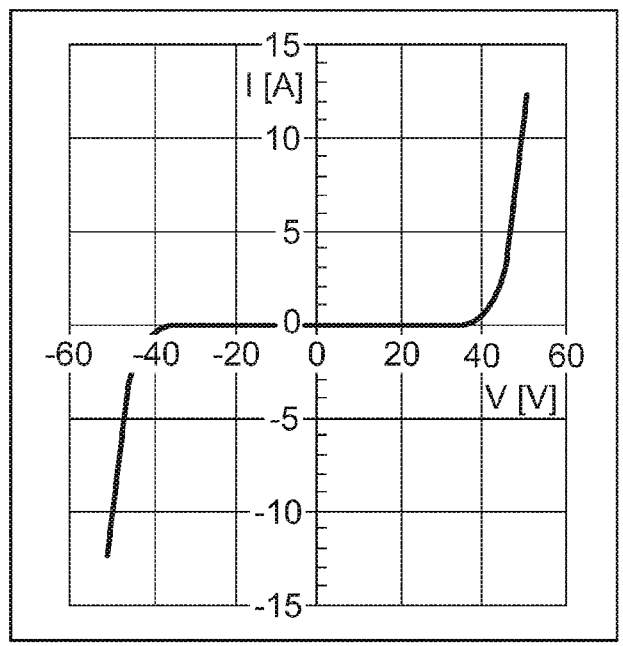

FIGS. 3A-3B show a different circuit according to a first embodiment of the ESD protection circuit 30. From this figure it can be seen that the ESD protection circuit 30 consists of a first partial circuit 35a and of a second partial circuit 35b. The first partial circuit 35a is provided between the first ground line GND1 and the second ground line GND2, and upon reaching the breakdown voltage, the line carries a current. The second partial circuit 35b is provided between the second ground line GND2 and the first ground line GND1 and carries current in this direction, upon reaching the breakdown voltage of the Zener diode 40a in the partial circuit 35a. In other words, the first partial circuit 35a and the second partial circuit 35b are substantially identical, but are connected in reverse directions. This means that the breakdown voltage in the corresponding Zener diodes 40a and 40b in the first partial circuit 35a and the second partial circuit 35b can/are intended to have a similar breakdown voltage. Should an electrostatic discharge take place, either the first partial circuit 35a or the second partial circuit 35b can carry the current when the breakdown voltage of the corresponding Zener diode 40 is reached. This effect is shown in the current-voltage characteristic.

Figure 4A:
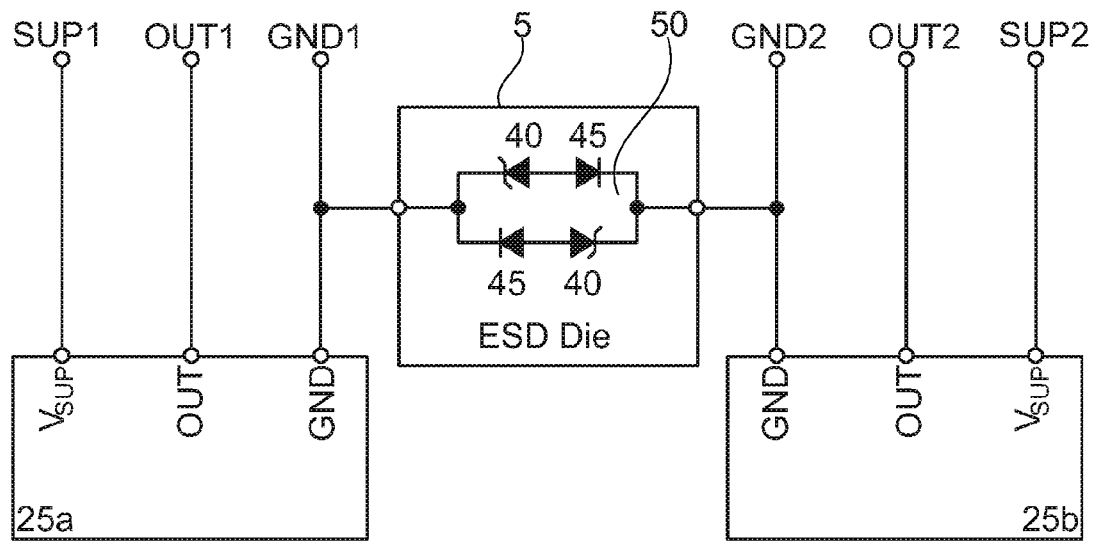
FIGS. 4A-4B show a second embodiment of the ESD protection circuit.
Figure 4B:
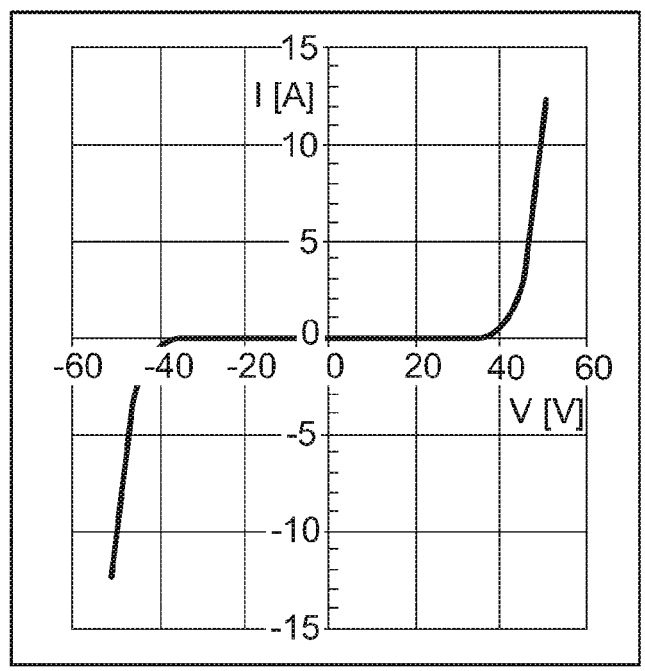

FIGS. 4A-4B shows a further embodiment in which a further semiconductor chip 50 is used for the ESD protection circuit 30. This second embodiment is expedient for the case that the space ("real estate") on the first semiconductor chip 20a and the second semiconductor chip 20b is insufficient for the ESD protection circuit.

Figure 5A:
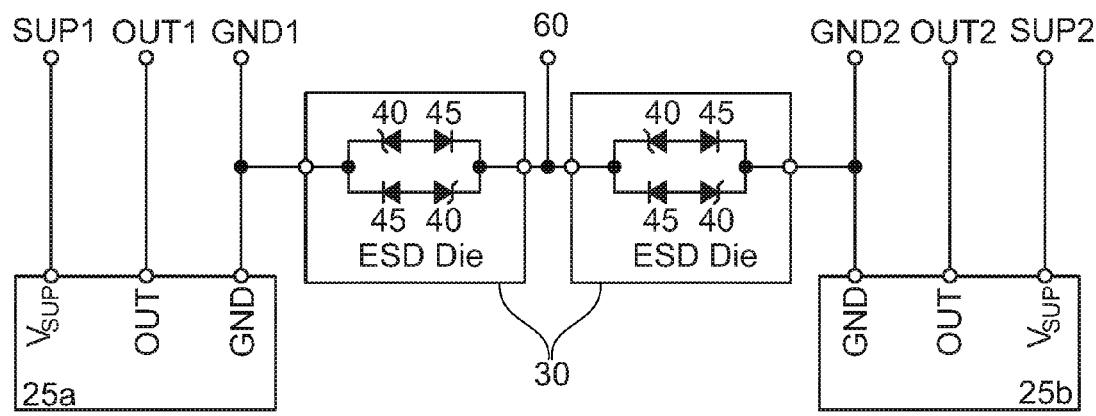
FIGS. 5A-5B show a third embodiment of the ESD protection circuit.
Figure 5B:
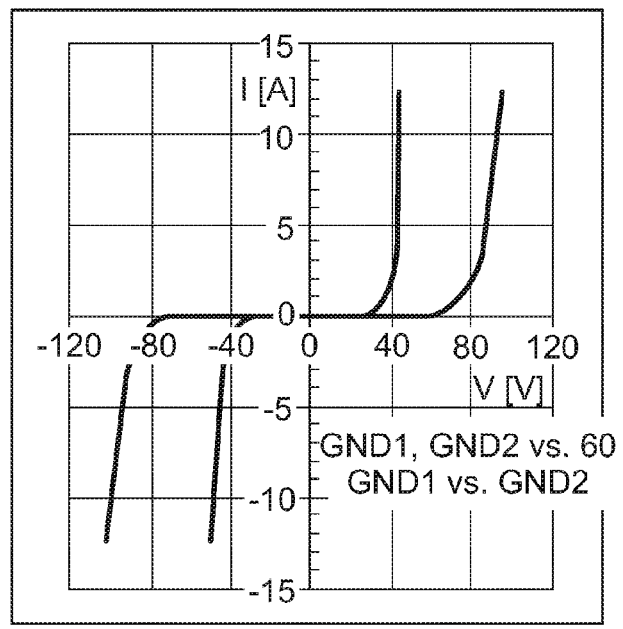

A further embodiment of the semiconductor arrangement is shown in FIG. 5A, in which two ESD protection circuits 30 are present between the first semiconductor chip 20a and the second semiconductor chip 20b. A connector 60 (a so-called exposed die pad) is present between the two ESD protection circuits 30. The connector 60 must also be protected for both directions of polarities vis-à-vis the first semiconductor chip 20a and the second semiconductor chip 20b. The associated current-voltage characteristic is also shown in FIG. 5B. The voltage drop depends on whether the connector 60 is supplied with a voltage or not.

Figure 6A:
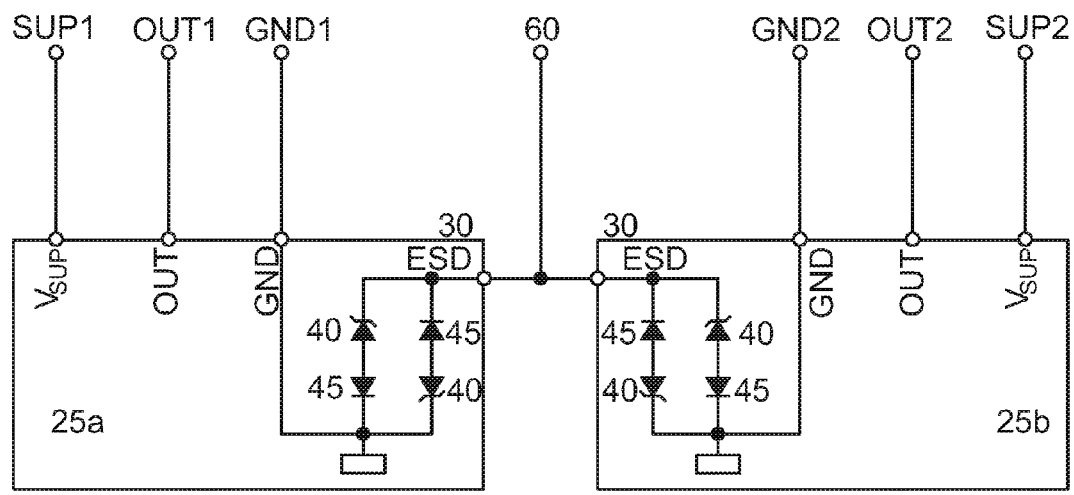
FIGS. 6A-6B show a fourth embodiment of the ESD protection circuit.
Figure 6B:
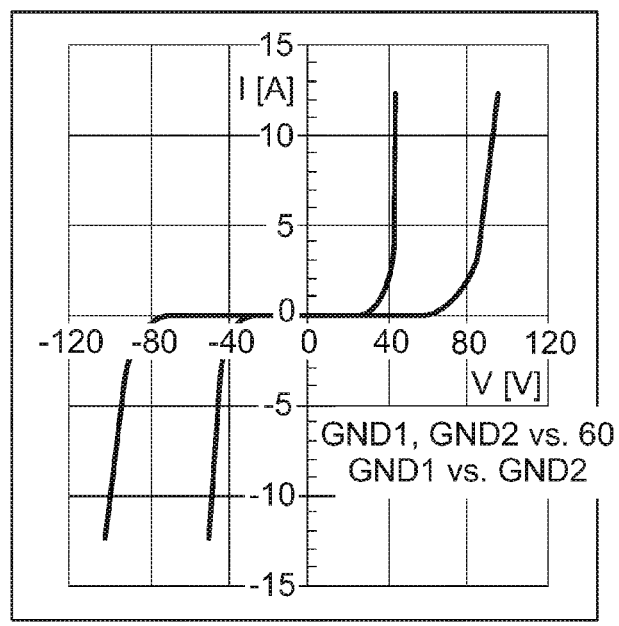

A similar embodiment is represented in FIGS. 6A-6B, in which the two ESD protection circuits 30 are attached respectively to the first semiconductor chip 20a or the second semiconductor chip 20b.

Figure 7A:
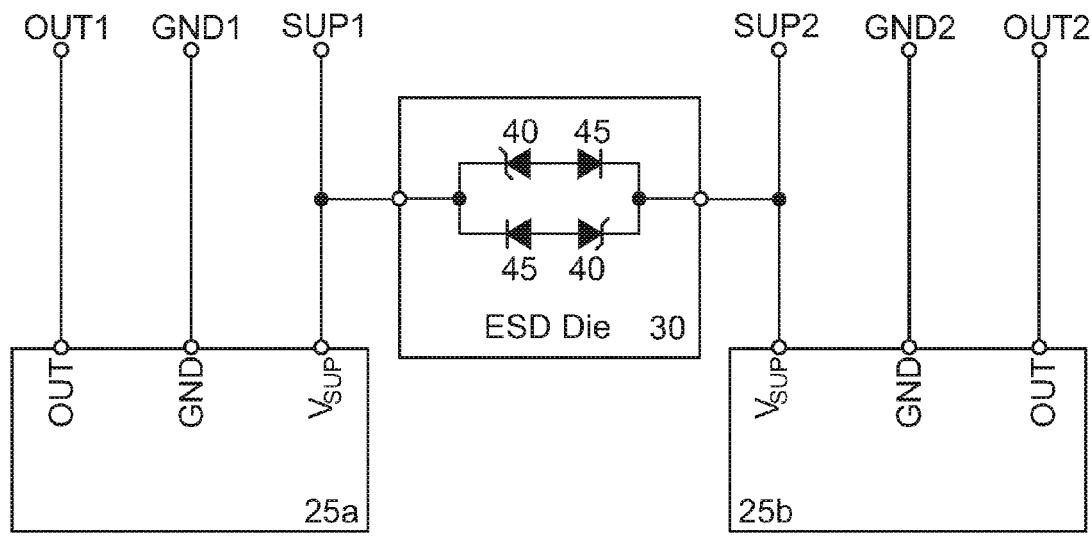
FIGS. 7A-7B show a fifth embodiment of the ESD protection circuit.
Figure 7B:
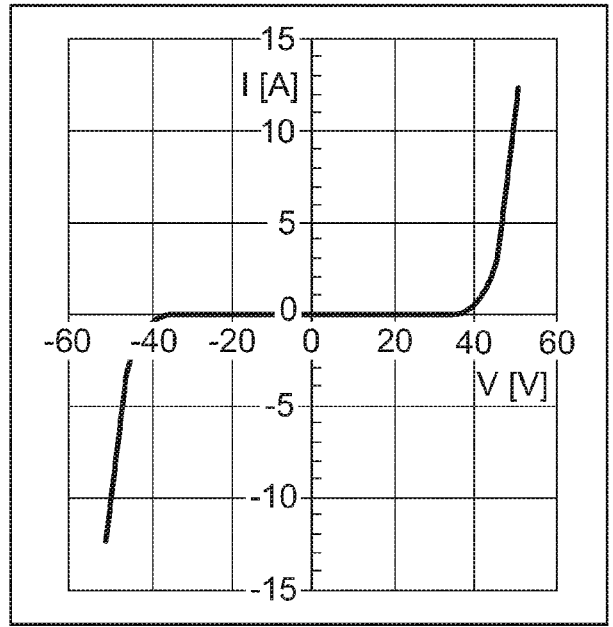
Figure 8A:
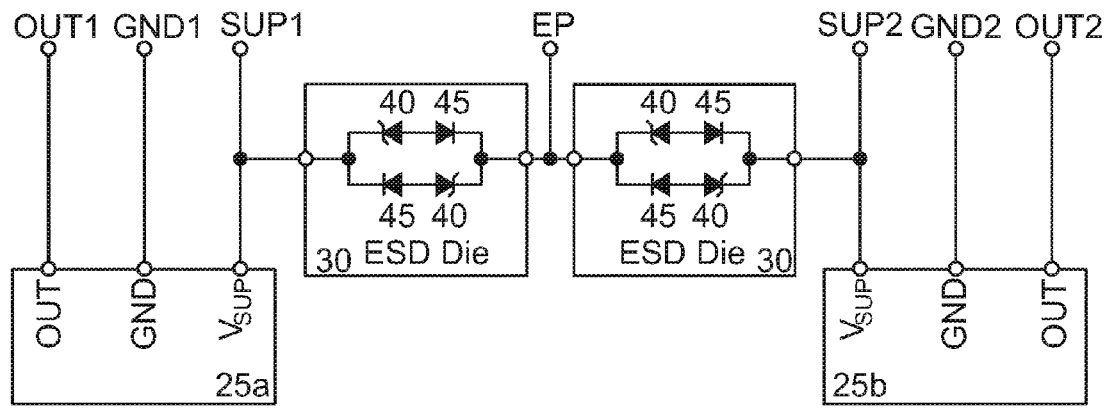
FIGS. 8A-8B show a sixth embodiment of the ESD protection circuit.
Figure 8B:
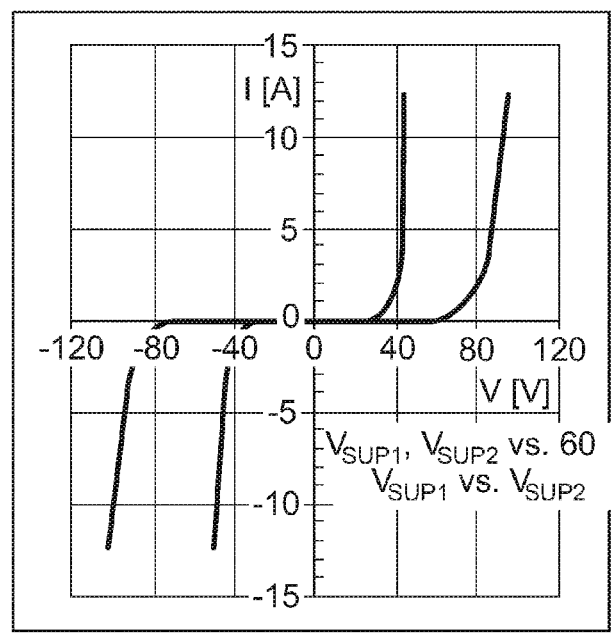

In FIG. 7A the ESD circuit 30 is provided between the supply line SUP1 and the second supply line SUP2. FIGS. 7A-7B shows that at least one ESD protection circuit 30 can likewise be inserted between the supply lines SUP1 and SUP2. A similar embodiment is represented in FIGS.

8A-8B, in which the two ESD protection circuits 30 are present on one or two further semiconductor chip(s).

What is claimed is:

1. A semiconductor arrangement, comprising:
a first semiconductor chip with a first integrated circuit and a first partial circuit;
a second semiconductor chip with a second integrated circuit and a second partial circuit; wherein the first partial circuit and the second partial circuit form together an electrostatic discharge (ESD) protection circuit, and wherein the first semiconductor chip is otherwise isolated from the second semiconductor chip and the first integrated circuit is connected to the second integrated circuit exclusively via the ESD protection circuit.

2. The semiconductor arrangement according to claim 1, wherein the ESD protection circuit is connected between a first ground line on the first semiconductor chip and a second ground line on the second semiconductor chip.

3. The semiconductor arrangement according to claim 1, wherein the ESD protection circuit is connected between a first supply line on the first semiconductor chip and a second supply line on the second semiconductor chip.

4. The semiconductor arrangement according to claim 1, wherein the first partial circuit is configured to be substantially identical to the second partial circuit.

5. The semiconductor arrangement according to claim 1, wherein the ESD protection circuit is integrated in a third semiconductor chip.

6. The semiconductor arrangement according to claim 1, wherein the ESD protection circuit has two branches and each of the two branches has respectively one diode and one Zener diode, which are connected in series.

7. The semiconductor arrangement according to claim 1, wherein the first semiconductor chip is stacked onto the second semiconductor chip.

8. The semiconductor arrangement according to claim 1, wherein the first semiconductor chip is arranged next to the second semiconductor chip.

9. The semiconductor arrangement according to claim 1, wherein two ESD protection circuits are connected in series between the first integrated circuit and the second integrated circuit.

10. The semiconductor arrangement according to claim 9, wherein a connector is present between the two ESD protection circuits.

11. The semiconductor arrangement according to claim 1, wherein the first semiconductor chip and the second semiconductor chip are accommodated in a common housing.

12. A semiconductor arrangement comprising:
a first semiconductor chip with a first integrated circuit;
a second semiconductor chip with a second integrated circuit; and
an electrostatic discharge (ESD) protection circuit;
wherein the first semiconductor chip is otherwise isolated from the second semiconductor chip and the first integrated circuit is connected to the second integrated circuit exclusively via the ESD protection circuit; and
wherein the ESD protection circuit has two branches and each of the two branches has respectively one diode and one Zener diode, which are connected in series.

13. A semiconductor arrangement comprising:
a first semiconductor chip with a first integrated circuit;
a second semiconductor chip with a second integrated circuit; and
an electrostatic discharge (ESD) protection circuit;
wherein the first semiconductor chip is otherwise isolated from the second semiconductor chip and the first integrated circuit is connected to the second integrated circuit exclusively via the ESD protection circuit; and
wherein two ESD protection circuits are connected in series between the first integrated circuit and the second integrated circuit.

* * * * *